United States Patent [19]
Young

[11] Patent Number: 4,620,991

[45] Date of Patent: Nov. 4, 1986

[54] APPARATUS FOR THE IMPREGNATION OF POROUS ARTICLES

[75] Inventor: Peter D. Young, Guernsey, Channel Islands

[73] Assignee: Ultraseal International Limited, Guernsey, Channel Islands

[21] Appl. No.: 696,801

[22] Filed: Jan. 31, 1985

[30] Foreign Application Priority Data

Feb. 2, 1984 [GB] United Kingdom ................ 8402770

[51] Int. Cl.[4] ......................... B05D 1/18; B05D 3/00; C23C 14/00

[52] U.S. Cl. ...................................... 427/294; 118/50; 118/429; 427/430.1

[58] Field of Search .................. 118/50, 429; 427/294, 427/295, 430.1

[56] References Cited

U.S. PATENT DOCUMENTS

| | | | |
|---|---|---|---|
| 4,311,735 | 1/1982 | Young | 427/295 |
| 4,384,014 | 5/1983 | Young | 427/294 |
| 4,479,986 | 10/1984 | Juday | 427/295 |
| 4,520,045 | 5/1985 | Kutsuna et al. | 427/294 |

*Primary Examiner*—Michael R. Lusignan
*Attorney, Agent, or Firm*—Oblon, Fisher, Spivak, McClelland & Maier

[57] ABSTRACT

A pressure vessel for use in impregnating porous articles comprising a support member for the articles, slidable between an upper position for degassing the articles and a lower position for impregnating the articles, a release mechanism operable from outside the pressure vessel to permit the support member to descend from the upper position to the lower position under gravity, and damping means at least partially within the pressure vessel for controlling descent of the support member.

13 Claims, 10 Drawing Figures

APPARATUS FOR THE IMPREGNATION OF POROUS ARTICLES

This invention relates to apparatus for the impregnation of porous articles, such as sintered metal articles and metal castings. Apparatus of this general type is described for example in our U.K. Patent Specifications Nos. 2 049 751, 2 072 231 and 2 094 674. Generally stated the article is placed in a pressure vessel to which a vacuum is subsequently applied so that air is withdrawn from the pores. Impregnant is then admitted to the vessel so that it covers the article and enters the pores. Air is then admitted to the vessel and the impregnant allowed to drain off. This is a so-called dry vacuum process which has the advantage over a wet vacuum process in that air is readily withdrawn from the pores. In the wet vacuum process, the article is submerged in impregnant before the vacuum is drawn. However, although the dry vacuum process is advantageous, there are technical difficulties in feeding impregnant to the pressure vessel and removing it therefrom during each operation cycle. More specifically there are separate storage tanks, valves, level switches, etc., all of which can go wrong. Such misfunctioning can be particularly serious if for example the pressure vessel overfills and impregnant is sucked into the vacuum pump.

The invention is concerned with a particularly effective arrangement within the pressure vessel for lowering the article into the impregnant after the vacuum has been drawn, the impregnant remaining in the vessel throughout the operating cycle.

According to the invention, there is provided a pressure vessel for use in impregnating porous articles, comprising a support member for the articles, slidable between an upper position for degassing the articles and a lower position for impregnating the articles, a release mechanism operable from outside the vessel to permit the support member to descend from the upper position to the lower position under gravity, and damping means at least partially within the pressure vessel for controlling descent of the support member.

Preferred features of the invention are set out in the claims and described in more detail below.

Preferred embodiments of the invention will now be described with reference to the drawings in which.

Figure 1:
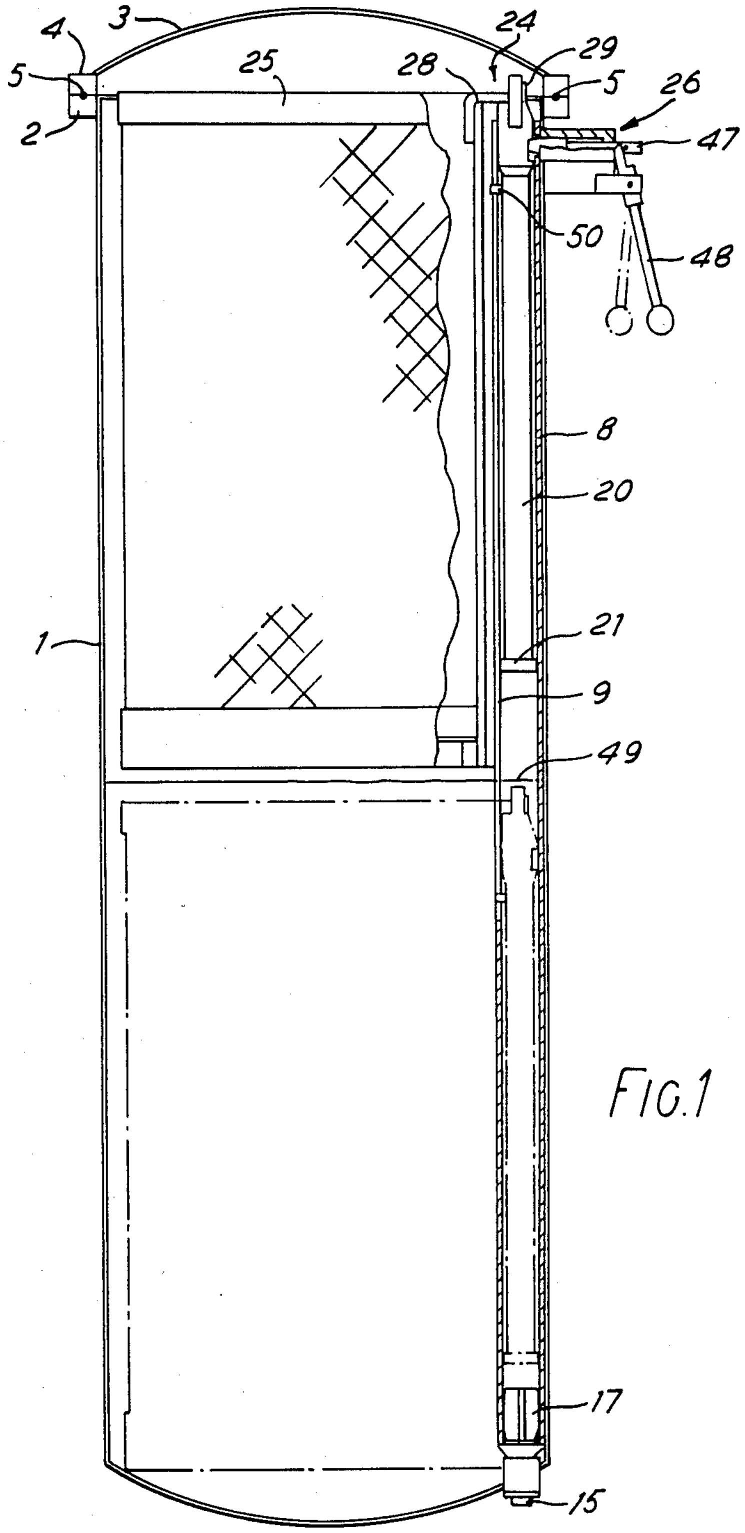
FIG. 1 is a vertical section through an impregnation autoclave showing a basket in full lines in the upper position and a basket in ghost lines in the lower position.
Figure 2:
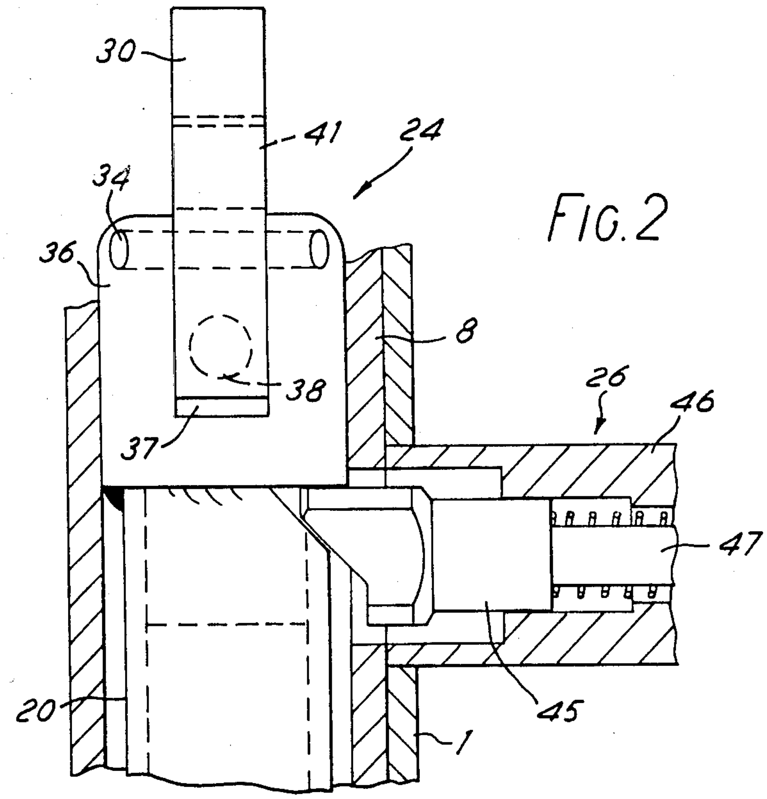
FIG. 2 shows a detail of the upper part of the autoclave.

The construction and operation of the embodiment of FIGS. 1 to 4 will now be described.

The autoclave comprises a main cylindrical body 1 with a flange 2 at the upper end. A removable domed lid 3 has a corresponding flange 4 and can be clamped against the main body 2 by conventional clamps (not shown) with a resilient ring seal 5 interposed between flanges 2 and 4.

A vertical cylindrical tube 8 is fixed mounted on the inside wall of the autoclave and has a vertical slot 9 on the inside which extends from the top to about the midpoint of the tube.

Figure 3:
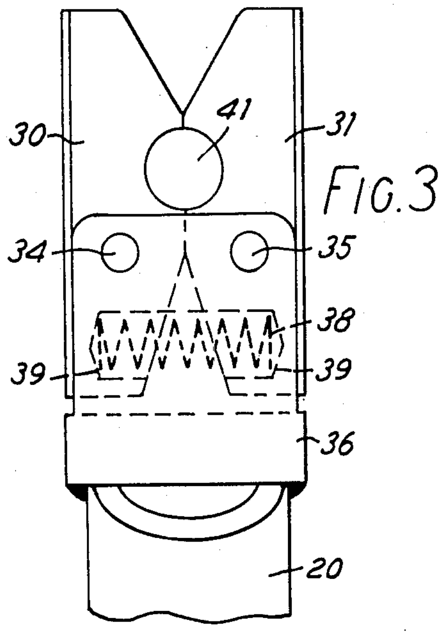
FIG. 3 shows a side view of the upper part of the piston shown in FIG. 2.
Figure 4:
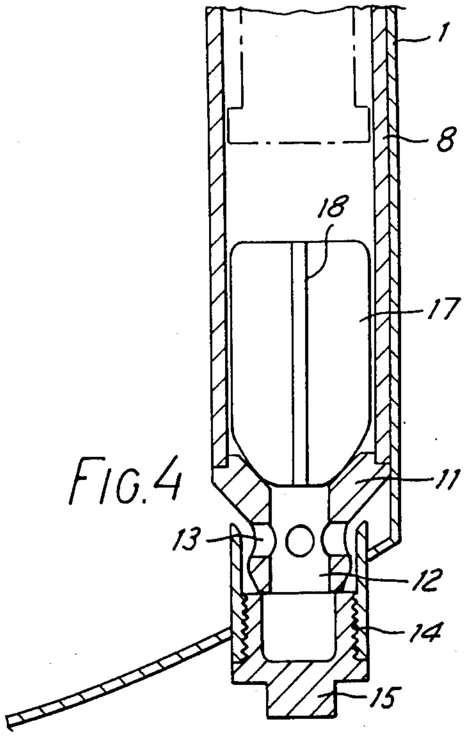
FIG. 4 shows a detail of the lower part of the autoclave.

As shown in FIG. 4, the lower end of the tube 8 is attached to a drain fitting 11 which has a central bore 12 and radial bores 13. The lower end of the fitting 11 is located within a drain opening provided by an internally-threaded sleeve 14 welded or otherwise sealingly secured in an opening in the cylindrical body 1. The lower end of the sleeve 14 is normally closed by a screw-threaded drain plug 15. A shuttle 17 in the form of a metal block with a bevelled lower end and a relatively narrow through-bore 18 is free to move vertically in the tube 8 but normally rests in a recess on the drain fitting 11 as shown in FIG. 3 under the action of gravity. In this position, impregnant flowing down the tube 8 can pass through the bore 18, the bore 12 and the bores 13 into the main part of the autoclave but only at a relatively slow rate. On the other hand, impregnant flow in the opposite direction can take place more rapidly as the flow can lift the shuttle 17 and let it be carried upwardly to the vicinity of slot 9 in the tube 8.

Also slidable within the tube 8 is a piston 20 with a head 21 at its lower end which fits the tube quite closely. Thus when the head 21 descends below the lower end of slot 9, downward movement of the piston 20 under gravity is damped because of limited impregnant flow through bore 18 as previously described. Some impregnant passes between the head 21 and the tube 8 and this is acceptable.

The upper part of piston 20 has a mechanism 24 for holding a basket 25 and a release mechanism 26 is provided which allows the basket 25 and the piston 20 to descend under gravity after the vacuum has been drawn.

The basket 25, which may for example hold metal castings, is of conventional framed cylindrical type with metal mesh walls, bottom and lid. It has a cantilever support arm 28 with a head 29 at the end. The mechanism 24 comprises a pair of members 30, 31 pivoted on respective pins 34, 35 extending transversely of an upper head 36 on the piston 20, the head 36 having a transverse slot 37 to receive the lower ends of members 30, 31. The members 30, 31 are urged into the position illustrated by a compression spring 38 located in recesses 39 in their lower ends but can be forced apart at their upper ends by descent of basket arm 28 into the V formed by their upper ends as a basket is lowered into the autoclave by a conventional hoist (not shown). Further descent of the arm 28 permits it to lodge in the circular opening 41 formed by members 30, 31. The basket can be released after impregnation by moving it upwards so forcing the members 30, 31 apart again.

The release mechanism 26 comprises a bevelled spring-loaded catch 45 which engages under the head 36 as soon as the head 36 passes it on its upward movement. The catch 45 fits slidably in a horizontal support tube 46 with an appropriate ring seal (not shown) and is extended by a rod 47. As shown in FIG. 1 the rod 47 can be withdrawn by a pivoted hand lever 48 to release the catch 45 and allow the piston and the basket to fall slowly under gravity to the ghost-line position, the arm 28 being aligned with the slot 9 and the autoclave being filled with impregnant to about the level 49. After impregnation, the lid 3 is removed and the basket 25 is lifted with a hoist back to the full-line position. During this operation, the shuttle 17 follows the piston 20 and permits a rapid upward movement. The shuttle 17 descends under gravity to the FIG. 4 position while the first basket is being allowed to drain before removal from the autoclave and the next basket is being loaded into the autoclave.

To prevent twisting the piston 20 has a lug 50 which engages in slot 9.

The arrangement is simple and effective and in particular provides a simple means for permitting a slow fall of the basket together with a rapid lift operation. Pneumatic damping means could also be used but would be more complex and would involve closer tolerances.

Figure 5:
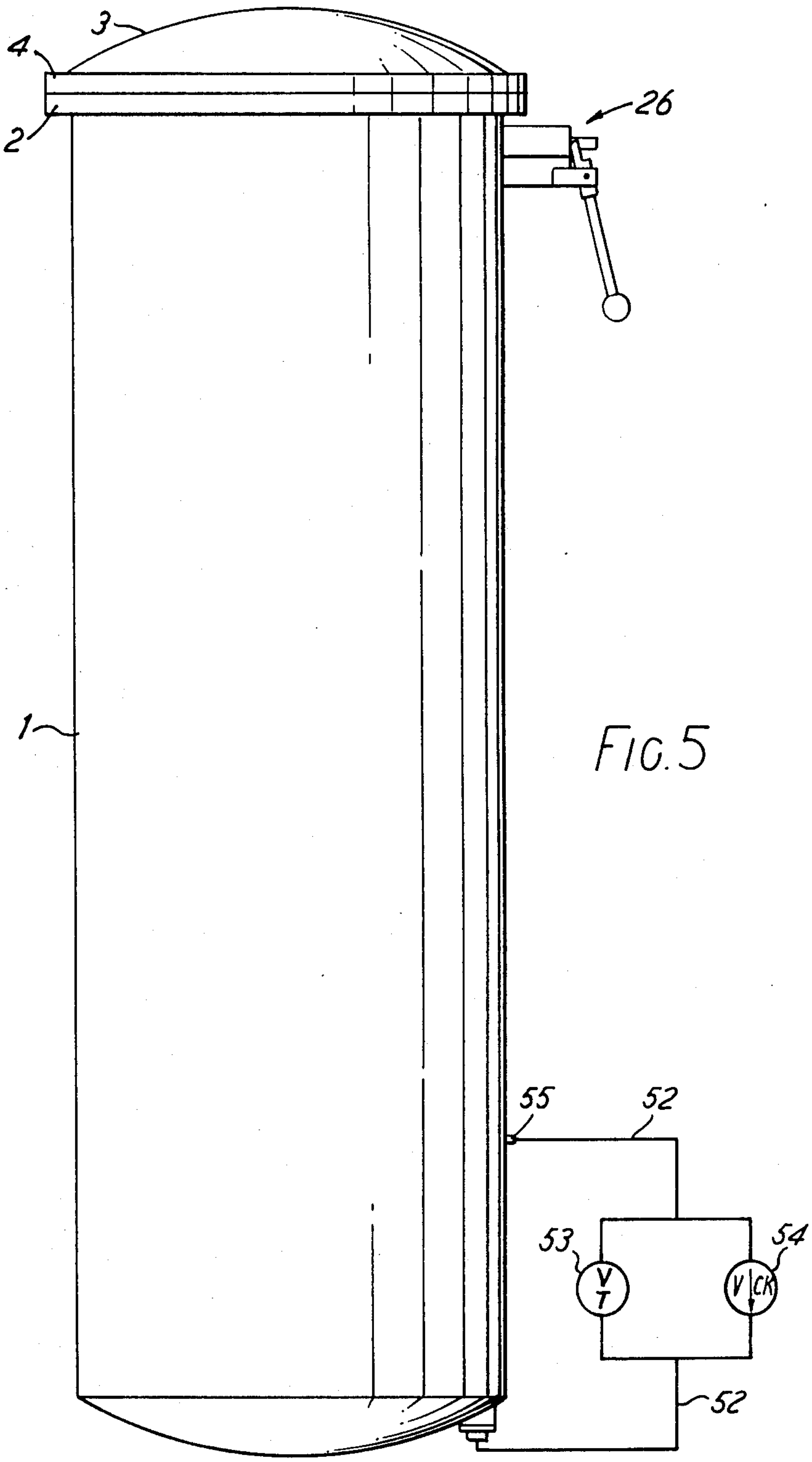
FIG. 5 shows diagrammatically a modified impregnation autoclave in which a flow regulator and check valve for controlling the damping are provided outside the main body of the autoclave.

In the FIG. 5 modification, there is no shuttle 17 and the drain fitting 11 sealingly engages the upper end of sleeve 14, the bores 13 being omitted. A line 52 connects the lower end of the sleeve to a flow regulator 53 and a check valve 54 arranged in parallel and continues to a port 55 in the main body of the autoclave at a point below the minimum level of impregnant. This prevents air being drawn into the line 52 when the basket 25 is being lifted by the hoist from its lowermost position. Bleed valves may of course be provided to ensure that line 52 is completely full of impregnant before the impregnation cycle is started. Of course, a single valve could act as a variable flow regulator and a check valve if necessary.

The operation is similar to that described with reference to FIG. 1. The adjustable flow regulator 53 damps descent of the basket and the check valve 52 permits it to be raised rapidly.

Referring now to FIGS. 6 to 10, the autoclave has an upper body member 61 and a lower body member 62 of approximately equal volumes. In the closed position, the upper flange 63 of the lower member 62 and the lower flange 64 of the upper member abut with a seal (not shown) interposed in the way shown for seal 5 in FIG. 1. The upper member 61 can be lifted to the upper chain dotted position by a hoist mechanism (not shown) and lowered again to reform the autoclave as desired.

Two vertical tubes 65 are vertically mounted in and secured to the wall of the lower body member 62 by a lower horizontal bracket 66 and upper horizontal brackets 67. The upper ends of the tubes 65 extend upwards into a recess 68 in the upper end wall of the upper body member 61. Each tube 65 contains a piston 70 with a head 71 which fits the inside of the tube 65 quite closely (in a similar way to the piston head 21 and tube 8 of FIG. 1). Mounted on the outside of the tubes 65 for vertical sliding movement therealong is a basket support carriage 74. The carriage comprises upper and lower horizontal plates 75, 76 interconnected at one side by a vertical plate 78. The plates 75, 76 are generally rectangular but have semicircular cut-outs 77 of the same radius as the outside radius of the tubes 65. Thus any twisting movements due to the weight of the basket are taken up by the outsides of the tubes 65.

Figure 6:
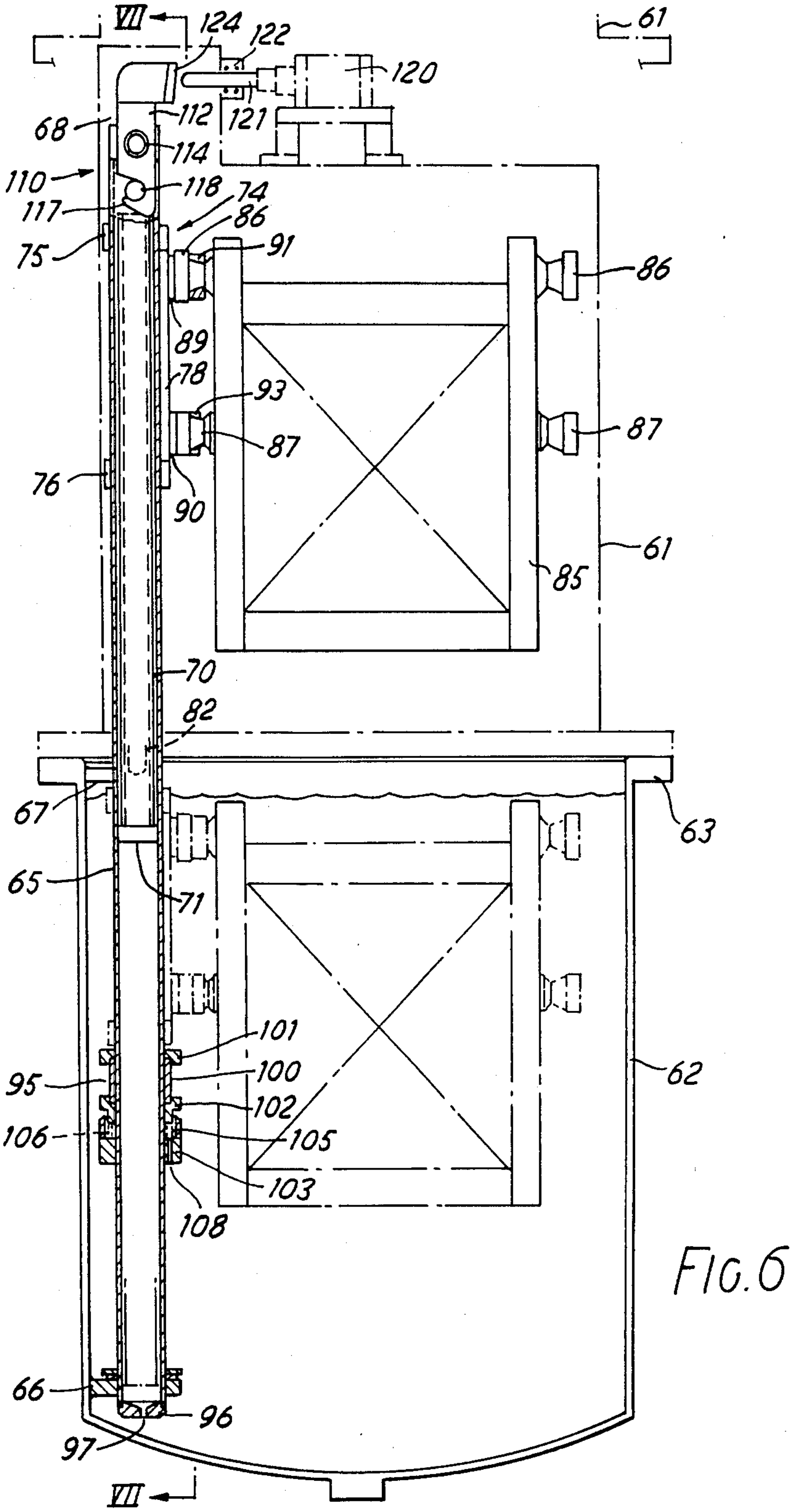
FIG. 6 shows diagrammatically a vertical section of a third embodiment of an autoclave according to the invention.
Figure 7:
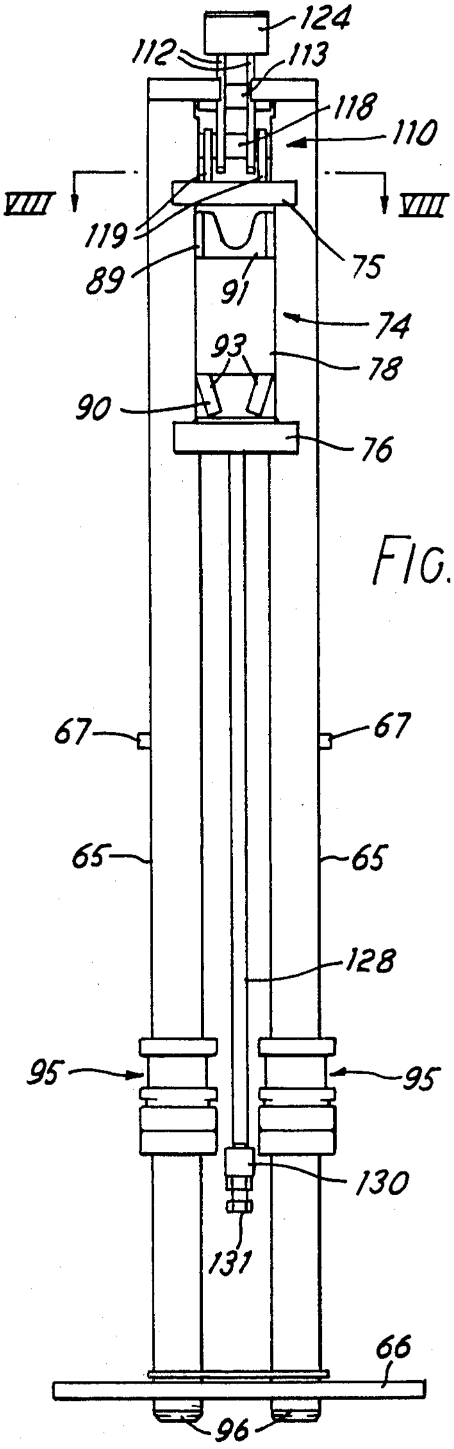
FIG. 7 is a view of the basket support mechanism taken on line VII—VII of FIG. 6.

Mutually facing vertical slots 82 in the tubes 65 extend downwardly to the point shown in FIG. 6 above the level of the liquid impregnant and these permit interconnection of the carriage 74 and the pistons 70 as described in more detail below.

On each side of the basket 85 there are upper and lower support lugs 86, 87, the lugs on one side respectively engaging upper and lower holding devices 89, 90 on the carriage plate 78. The upper holding device 89 comprises a grooved plate 91 spaced from plate 78 so that the head of the lug 86 can fit behind it with the shaft of the lug in the groove. The lower holding device 90 comprises a pair of inclined plates 93 between which the head of the lug 87 rests.

The carriage 74 (and the basket 85 and pistons 70) may descend to the ghost line position below the surface of the impregnant as hereinafter described. A shock absorber device 95 on each tube 65 comes into operation before the piston head 71 comes into contact with the lower end of the tube which consists of a plug 96 with a bleed hole 97. The device 95 comprises a sleeve 100 slidable on the outside of the tube 65 and having an upper collar 101 for abutment with lower end of the carriage 74 and a lower collar 102 for engagement with the upper end of a fixed collar 103 on the tube 65 (if the shock absorber device is used to full capacity). The collar 103 provides an annular upwardly facing recess 105 with the tube 65 in which is mounted a helical compression spring 106 which supports the sleeve 100, the lower end of the sleeve 100 fitting within the recess 105. A damping effect is provided by a bleed hole 108 in the collar 103.

A latch 110 for supporting the carriage 74 in its upper position is provided at the upper end of the tubes 65 and comprises a pair of vertical plates 112 fixed to a sleeve 113 rotatable on a horizontal shaft 114, the ends of the shaft being held in bores 115 in end plugs 116 of the tubes 65. The lower ends of the plates 112 are in the form of hooks 117 which carry the carriage 74 via a horizontal rod 118 secured to the top of the carriage by a pair of brackets 119. The latch is biased to the position shown against stop 125, by a torsion spring (not shown) and the lower sides of the hooks 117 are bevelled so that the hooks 117 may be pushed aside by the rod 118 as the carriage 74 is lifted. The latch 110 may be tripped from outside the autoclave by a hydraulic cylinder 120 on the top of the upper body member 61, the rod 121 thereof passing through a seal 122 into the interior of the autoclave in such a way that it can abut a plate 124 joining the upper ends of plates 112. The ends of the rods 118 extend through the slots 82 in the tubes 65 and into bores 123 in the top of pistons 70 with a loose fit so that non-vertical forces are not applied to the pistons.

Figure 8:
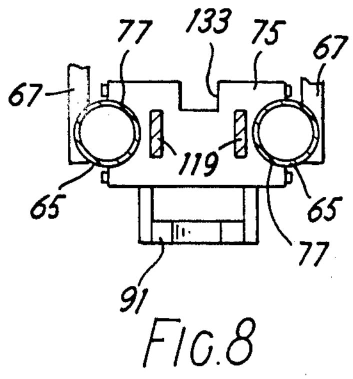
FIG. 8 is a section on line VIII—VIII of FIG. 7 (with the pistons omitted)
Figure 9:
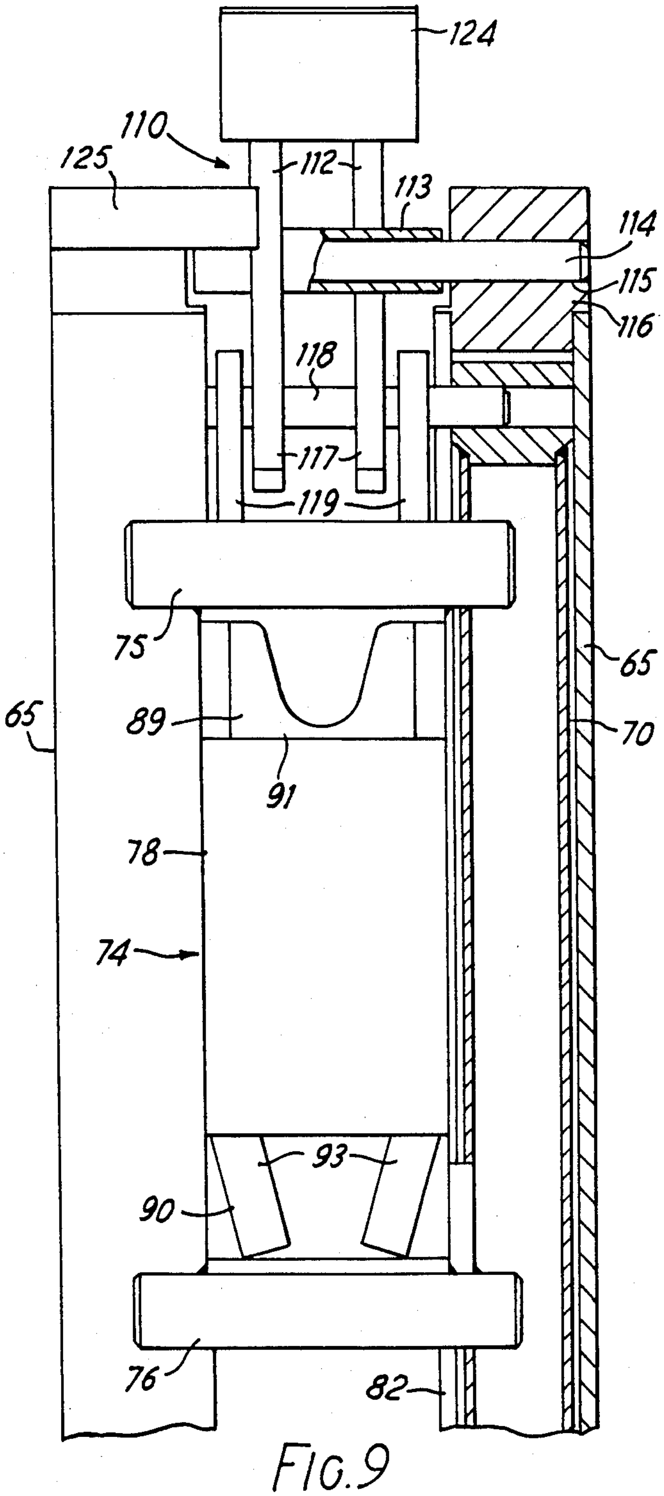
FIG. 9 is an enlargement of part of FIG. 7, partly in section.
Figure 10:
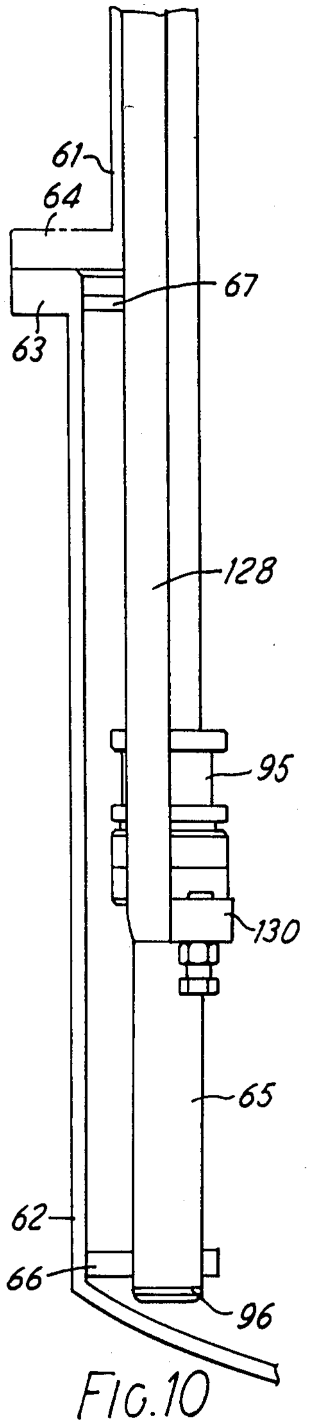
FIG. 10 is a view similar to the lower part of FIG. 7 but at a different radial position.

A square lifting rod 128 is secured at its upper end to the body member 61 as shown in FIG. 10 and at its lower end has a horizontal bar 130 extending therefrom so as to extend beneath the lower carriage plate 76. The bar 130 has a vertical bolt 131 therethrough which provides an adjustable stop. As shown in FIG. 8 carriage plates 75 and 76 have rectangular recesses 133 to accommodate the rod 128.

The cycle of operation starts with the upper body member 61 raised and the carriage 74 in its upper, latched, position. A basket 85 is loaded onto the carriage as shown in FIG. 6 and the body member 61 lowered till the autoclave is sealed. A vacuum is then drawn and the latch 110 is tripped by operation of the cylinder 120. The carriage 74 and basket 85 then descend slowly due to fluid damping because the piston heads 71 are past the lower ends of the slots 82 and fluid can only escape from the lower ends of the tubes 65 through the bleed holes 108 and past the piston heads 71. After impregnation with the basket 85 in the ghost line position immersed in impregnant, the upper body member 6 is again slowly lifted (in this case provision is not made to cut out the damping effect), the carriage 74 being lifted by rod 128 until it is held by the latch 110. The basket 85 is then unloaded (after a drain period).

I claim:

1. A pressure vessel for impregnating porous articles, comprising:

a sealable vessel body fillable with a liquid impregnant;

means for permitting the inducing of a vacuum in said vessel body;

a porous article support member positionable in said vessel body;

means for slidably mounting said support member in said vessel body for movement between an upper degassing position and a lower impregnating position;

means for releasably holding said support member in said upper position;

release means operable from outside said vessel body for releasing said means for holding, whereby said support member can descend to said lower position due to gravity; and damping means at least partially within said vessel body for controlling the rate of said descent, wherein said damping means includes a restricted passage and means responsive to said descent for forcing said impregnant through said restricted passage.

2. The vessel according to claim 1 including means for maintaining the damping means inoperative when the support member is raised from the lower position to the upper position.

3. The vessel according to claim 1 wherein the damping means is wholly within the pressure vessel body.

4. The vessel of claim 1 wherein said means for forcing comprises:

a tubular passage extending vertically in said vessel into said impregnant, said restricted passage being associated with a portion of said tubular passage; and a piston movable with said support member and slidable in said tubular passage.

5. The vessel of claim 4 including a shuttle member slidably positioned in said tubular member below said piston, said restricted passage extending through said shuttle member.

6. The vessel of claim 4 including:

conduit means for connecting impregnant in said tubular passage below said piston with a remainder of said impregnant, said conduit means including two parallel branches;

check valve means in one of said branches; and said restricted passage in the other of said branches.

7. The vessel of claim 1 wherein said means for releasably holding comprises a spring loaded catch holding said means for slidably mounting.

8. The vessel of claim 7 wherein said release means comprise a rod connected to said catch and extendable through a sealed opening in said vessel body, and means outside said vessel body for moving said rod in opposition to said spring for releasing said catch.

9. The vessel of claim 1 wherein said means for releasably holding comprise a spring loaded latch and said release means comprise a pin passing through said vessel body.

10. The vessel of claim 4 including:

two of said tubular passages, said tubular passages being comprised by a pair of vertical tubes;

a carriage slidable on the outside of said tubes and comprising said means for slidably mounting;

two of said pistons, each said piston being slidable in one of said tubes and being connected to said carriage;

wherein said restricted passage comprises means for restricting flow of impregnant from said tubes below said pistons.

11. The vessel according to claim 10 including hydraulic shock absorber means provided on the outside of at least one of said tubes to limit downward movement of the carriage.

12. The vessel according to claim 10 wherein said vessel body has a bottom part and a top movable vertically away from said bottom part for loading and unloading, wherein said tubes extend into said top part and said top part has a member engageable with said carriage to lift said carriage to an upper position as the top part is raised.

13. A method of impregnating a porous article comprising the steps of:

filling a sealable vessel body with a liquid impregnant;

positioning porous articles to be impregnated on a support member in said vessel body above said impregnant;

sealing said vessel body;

drawing a vacuum in said vessel body;

permitting said support member and porous articles to descend into said impregnant under the force of gravity;

using said impregnant in a damping means to control a rate of said descent;

releasing said vacuum;

opening said vessel body; and withdrawing said article from said vessel body.

* * * * *